United States Patent [19]
Zhou

[11] Patent Number: 5,038,187
[45] Date of Patent: Aug. 6, 1991

[54] PSEUDOMORPHIC MODFET STRUCTURE HAVING IMPROVED LINEAR POWER PERFORMANCE AT MICROWAVE FREQUENCIES

[75] Inventor: Guo-Gang Zhou, Novato, Calif.

[73] Assignee: Hewlett-Packard Company, Palo Alto, Calif.

[21] Appl. No.: 444,654

[22] Filed: Dec. 1, 1989

[51] Int. Cl.[5] .............. H01L 29/80; H01L 29/161; H01L 27/12

[52] U.S. Cl. .............. 357/22; 357/16; 357/4

[58] Field of Search .............. 357/22 A, 16

[56] References Cited

U.S. PATENT DOCUMENTS 4,967,242  10/1990  Sonoda et al. .............. 357/16

FOREIGN PATENT DOCUMENTS 0120669  1/1989  Japan .............. 357/72 A
0066972  3/1989  Japan .............. 357/22 A

OTHER PUBLICATIONS

Chen et al., "DC and RF Characterization of a Planar--Doped Double Hetero Junction MODFET", pp. 581-586.

Primary Examiner—Rolf Hille
Assistant Examiner—Wael Fahmy
Attorney, Agent, or Firm—William C. Milks, III

[57] ABSTRACT

A pseudomorphic MODFET structure suitable for microwave frequency large signal applications. This structure is able to improve the transconductance, $g_m$, at high gate bias and, thus, improve the linear power performance of the MODFET. A modified single quantum well InGaAs channel pseudomorphic MODFET structure replaces the conventional n+ AlGaAs or n+ AlInAs top carrier supply layer with an n+ GaAs carrier supply layer. Much flatter/broader $g_m$ and, hence, $f_t$ and $f_{max}$ versus gate voltage curves are obtained due to the improved parallel transport in the n+ GaAs layer. Consequently, improved $R_{1dB}$ and $G_{1dB}$ are achieved at microwave frequencies, which makes this MODFET structure advantageous for microwave linear power applications.

20 Claims, 6 Drawing Sheets

PSEUDOMORPHIC MODFET STRUCTURE HAVING IMPROVED LINEAR POWER PERFORMANCE AT MICROWAVE FREQUENCIES

BACKGROUND OF THE INVENTION

This invention relates to semiconductor devices operative at relatively high frequencies and, more particularly, to a high electron mobility transistor (HEMT) semiconductor device structure for achieving both high gain and high linear power operation at such frequencies. Specifically, the invention is directed to a pseudomorphic MODFET having an HEMT structure which preferably comprises an n+ GaAs layer as the carrier supply layer, instead of a conventional n+ $Al_xGa_{1-x}As$ or n+ $Al_xIn_{1-x}As$ carrier supply layer. The MODFET in accordance with the invention exhibits improved transconductance, $g_m$, at high gate bias and provides improved large signal linear power performance.

During the past several years, MODFETs having various structures have been studied extensively due to their high frequency performance relative to other semiconductor devices. MODFETs can achieve very high $P_{sat}$ due to their high carrier density and carrier velocity. However, the large signal linear power performance of MODFETs, such as their power at a $-1$ dB gain compression point, $P_{1db}$, and their harmonic/intermodulation power levels, is typically less than desired. See, for example, B. Kim, et al., "mm-Wave AlGaAs/InGaAs/GaAs Quantum Well Power MISFET", IEDM Tech. Dig., December 1988, pp. 168–171, and L. F. Lester, et al., "High Efficiency 0.25 μm Gate-Length Pseudomorphic Power Heterostructure FET's at mm-Wave Frequencies", 47th DRC Tech. Dig., June 1989, IVB-4.

FIG. 1 shows the small signal level equivalent circuit model for an FET. Under large signal levels, however, the values of almost all of the equivalent circuit parameters vary as functions of the gate bias, $V_{gs}$, and the drain bias, $V_{ds}$. Those variations cause gain compression, as well as increase the harmonic power levels, as the input power increases. See S. M. Perlow, "Basic Facts About Distortion and Gain Saturation", Applied Microwave, May 1989, pp. 107–117. FIG. 2 shows the output power and gain compression for a typical MODFET as the input power level increases. The major sources of nonlinear behavior in FETs under large signal conditions have been identified as $g_m$, $g_o$, and $C_{gs}$ variations as functions of the biases. See G. Lambrianou, et al., "Power Characterization of a MESFET Amplifier Using Small Signal Measurement and Volterra Series", IEEE MTT-S Digest, 1985, pp. 409∝412, and R. E. Williams, et al., "Graded Channel FET's: Improved Linearity and Noise Figure", IEEE Trans. on Elect. Dev., Vol. ED-25, No. 6, June 1978, pp. 600–605.

$g_m$ variation as a function of the gate voltage swing relates to the output power linearity of the FET. Consequently, the power/gain saturation curve for a conventional MODFET is usually soft, and $P_{1db}$ is not very high despite high saturation power due to maximum drain current. Also, the donors in the carrier supply layer can become partially ionized at high gate bias due to the relatively low donor energy level in the material. This partial ionization, together with the presence of the DX centers in the heavily doped AlGaAs or AlInAs material, limits the total carrier concentration in the device and degrades the modulation efficiency. See P. M. Mooney, et al., "The Role of DX Centres in Limiting the Free Carrier Density in GaAs", Proc. of Int. Symp. GaAs and Related Compounds, 1987, pp. 359–362, and M. C. Foisy, et al., "The Role of Inefficiency Charge Modulation in Limiting the Current-Gain Cutoff Frequency of the MODFET", IEEE Trans. on Elect. Dev., Vol. 35, No. 7, July 1988, pp. 871–878.

Degradation in $g_m$ at high gate bias has been found to be the dominant limiting factor for the power/gain saturation performance in MODFETs. See M. R. Weiss, et al., "An Investigation of the Power Characteristics and Saturation Mechanisms in HEMT's and MESFET's", IEEE Trans. on Elect. Dev., Vol. 35, No. 8, August 1988, pp. 1197–1206. This $g_m$ degradation also limits the digital applications of MODFETs, where the signal swing is always large.

The $g_m$ degradation at high gate bias occurs because almost all of the MODFET structures on GaAs substrates utilize an n+ AlGaAs or n+ AlInAs layer as the carrier supply layer. This carrier supply layer becomes conducting at high gate bias. See K. Lee, et al., "Parasitic MESFET in (Al, Ga)As/GaAs MODFET's and MODFET Characterization", IEEE Trans. on Elect. Dev., Vol. ED-31, No. 1, January 1984, pp. 29–35. Such a parasitic conduction, in parallel with the 2-D channel conduction, is undesirable, because the inferior transport property in the carrier supply layer results in low carrier mobility and velocity, which in turn cause low $g_m$, hence, low $f_T$ and $f_{max}$ at high gate bias according to Eq. 1 and Eq. 2, respectively:

$$f_T \approx \frac{g_m}{2\pi C_{gs}} \alpha \frac{v_s}{L_g} \quad (1)$$

$$f_{max} \approx f_T/2 \ (g_o \ R_{in})^{\frac{1}{2}} \quad (2)$$

where $C_{gs}$ is the gate capacitance, $v_s$ is the average saturation velocity, $L_g$ is the gate length, $g_o$ is the drain-source conductance, and $R_{in}$ is the input resistance of the MODFET.

Efforts have been made to achieve a more constant $g_m$ profile by providing a multiple quantum well structure (MQW) or doped channel MISFET structure. However, the MQW structure typically has lower gain, possibly due to the poor material growth compatibility; while the MISFET structure suffers low gain due to the degraded carrier velocity in the heavily doped channel. See G. W. Wang, et al., "A High-Current Pseudomorphic AlGaAs/InGaAs Double Quantum-Well MODFET", IEEE Elect. Dev. Lett., Vol. 9, No. 1, January 1988, pp. 4–6, and P. Sannier, et al., "A Double-Heterojunction Doped-Channel Pseudomorphic Power HEMT with a Power Density of 0.85 W/mm at 55 GHz", IEEE Elect. Dev. Lett., Vol. 9, No. 8, August 1988, pp. 397–398.

SUMMARY OF THE INVENTION

One embodiment of the present invention provides an InGaAs channel pseudomorphic MODFET structure which has improved linear power performance in the microwave frequency range. In the design of this structure, the conventional n+ AlGaAs or n+ AlInAs carrier supply layer is preferably replaced by an n+ GaAs carrier supply layer. Although the n+ GaAs/InGaAs heterojunction pair undesirably has an approximately 40% lower conduction band edge discontinuity than an n+ $Al_xGa_{1-x}As$/InGaAs or n+ $Al_xIn_{1-x}As$/InGaAs heterojunction pair, the n+ GaAs material is a higher mobility and higher velocity material. $g_m$ is improved at high gate bias due to the superior carrier transport property of n+ GaAs material compared to that of n+ AlGaAs and n+ AlInAs material. This $g_m$ improvement results in relatively flat and broad $f_T$ and $f_{max}$ versus gate bias. In an implementation of the pseudomorphic MODFET structure in accordance with one embodiment of the invention, high $P_{1db}$ of 0.68 W/mm with $G_{1db}$ of 12.9 dB and power-added-efficiency of 45% are achieved at 25 GHz on a fabricated $0.33 \times 120$ $\mu m^2$, device. This linear power performance exceeds that of known InGaAs channel pseudomorphic MODFETs of this gate length. The $P_{out}$ at the maximum-power-added-efficiency point of the pseudomorphic MODFET structure in accordance with the invention is as high as 0.81 W/mm with 10.9 dB gain and power-added-efficiency of 59%. Other advantages of this structure include less extrinsic delay at large signal levels due to improvement in saturation of drain and source access resistors, lower 1/f noise, and reduction of anomalies due to replacing the heavily doped n+ AlGaAs or n+ AlInAs carrier supply layer with the n+ GaAs carrier supply layer.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 4, comprising

FIG. 5, comprising FIG. 6, comprising

DETAILED DESCRIPTION OF THE PREFERRED EMBODIMENTS n+ AlGaAs or n+ AlInAs is incorporated as the carrier supply layer in conventional MODFET structures because it provides relatively high conduction band edge discontinuity as compared to other materials. This is advantageous for both small signal and large signal applications.

However, it has been discovered that under large signal levels, parallel conduction in the n+ AlGaAs or n+ AlInAs carrier supply layer occurs. This phenomenon degrades $g_m$ such that the desirable high conduction band edge discontinuity of the n+ AlGaAs or n+ AlInAs carrier supply layer is no longer a controlling factor in the value of $g_m$ at high gate bias. The prior art approaches to improvement of large signal linear power performance do not address this problem.

Considered in more detail, a parasitic conduction occurs in the carrier supply layer at high gate bias. Due to the poor carrier transport properties (poor mobility and velocity) of the conventional carrier supply layer, such as n+ $Al_xGa_{1-x}As$ or n+ $Al_xIn_{1-x}As$ carrier supply layer, $g_m$ is degraded at high gate bias. This $g_m$ degradation at high gate bias causes poor large signal output characteristics for an HEMT semiconductor device structure, which include signal distortion, soft power saturation curve, and poor power/gain combinations.

In accordance with the invention, it has been discovered that substitution of n+ GaAs for conventional n+ AlGaAs or n+ AlInAs as the carrier supply layer increases carrier mobility and velocity in the carrier supply layer and therefore improves $g_m$. This provides improved linear power performance in large signal applications.

The invention preferably replaces the conventional carrier supply layer with an n+ GaAs layer, since this carrier supply layer is relatively better in transport properties than those in conventional HEMT semiconductor device structures. $g_m$ at high gate bias is improved and, thus, the large signal output characteristics are improved accordingly. Therefore, HEMT semiconductor device structures with this carrier supply layer will be suitable for microwave linear power applications and digital applications, where signal swing is large.

Figure 1:
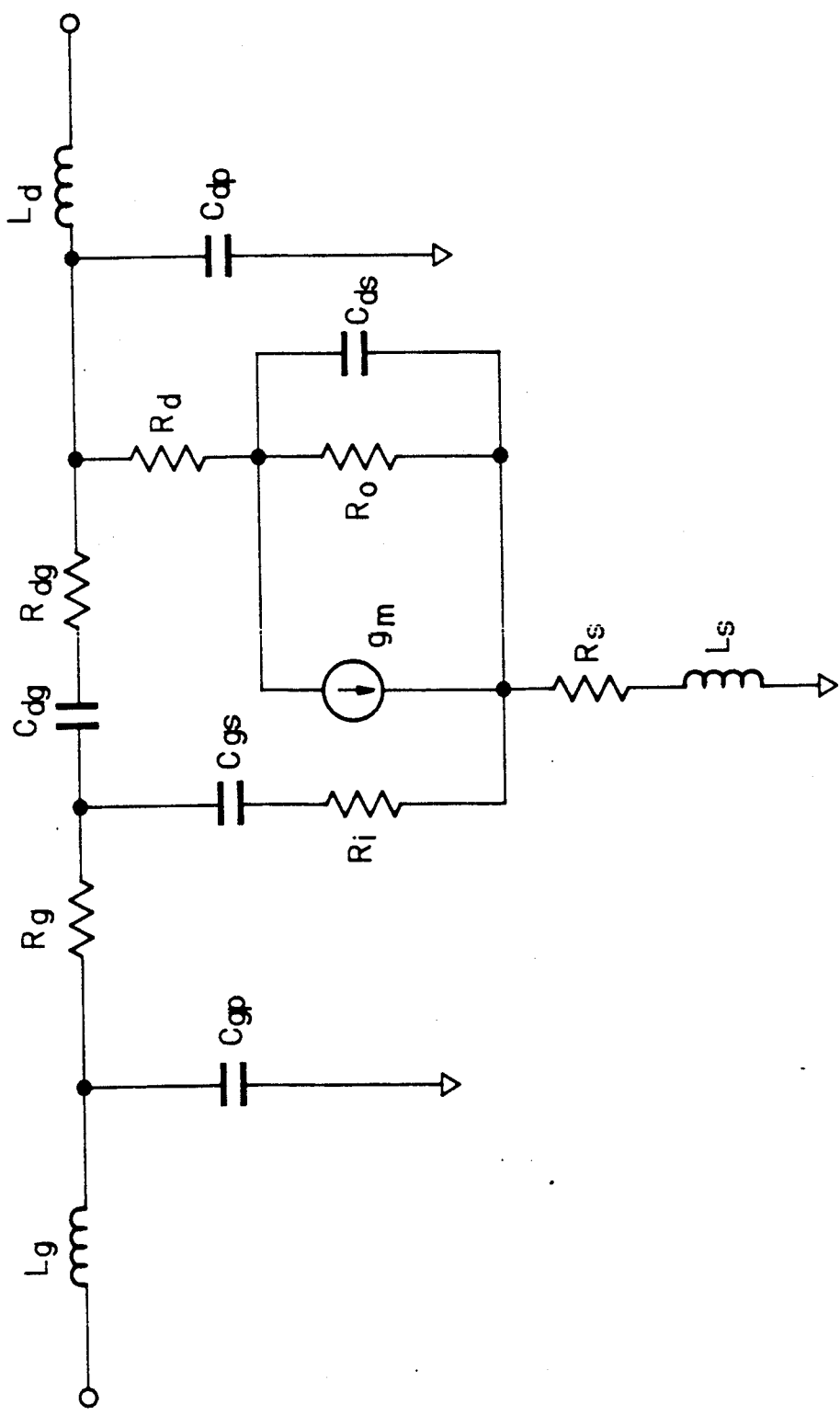
FIG. 1 shows a small signal level equivalent circuit model for an FET.
Figure 2:
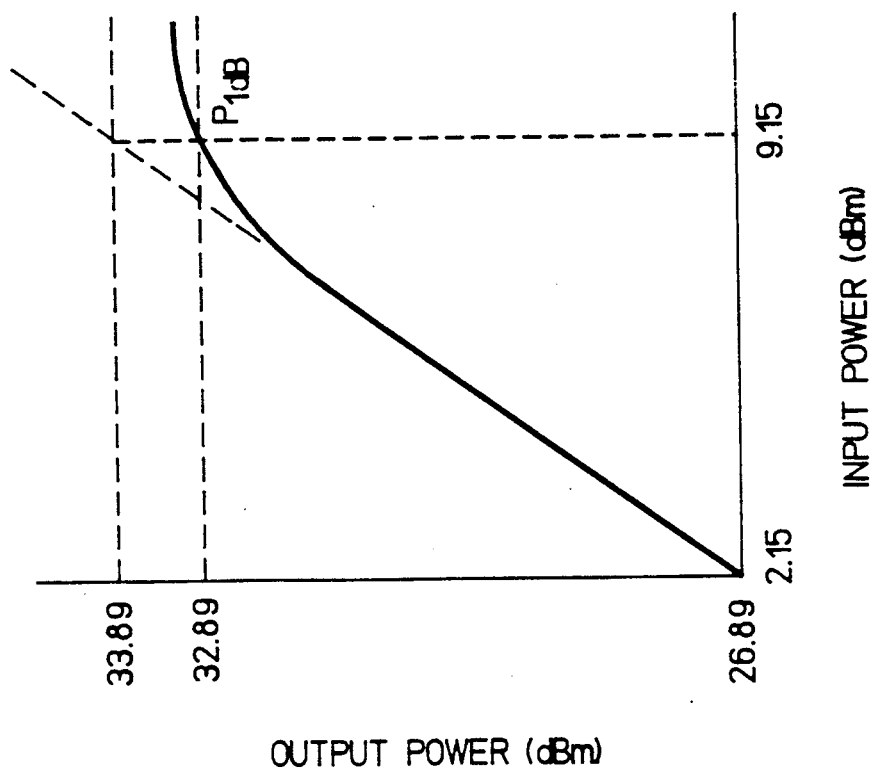
FIG. 2 illustrates output power and gain compression for a typical MODFET as the input power level increases.
Figure 3:
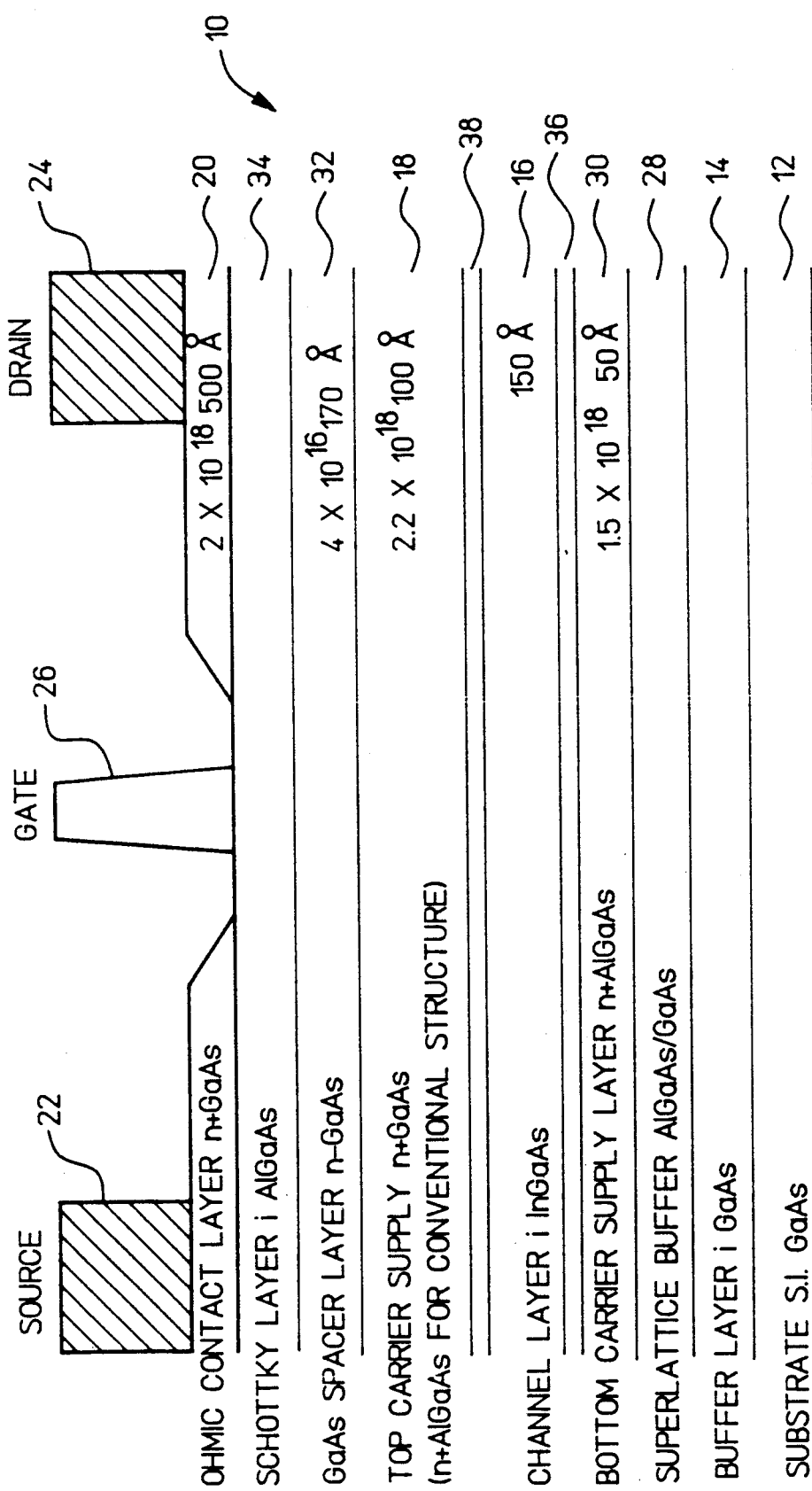
FIG. 3 shows a pseudomorphic MODFET structure in accordance with one embodiment of the invention, in which the top carrier supply layer is n+ GaAs, instead of n+ AlGaAs or n+ AlInAs as in the case of a conventional pseudomorphic MODFET.

Accordingly, in order to overcome the problem of the poor transport property in the carrier supply layer of conventional MODFETs, an improved InGaAs channel pseudomorphic MODFET structure is provided in accordance with the present invention. This structure preferably substitutes an n+ GaAs carrier supply layer for the conventional n+ AlGaAs or n+ AlInAs carrier supply layer on top of the undoped InGaAs channel, because the n+ GaAs carrier supply layer has a superior transport property to that of the conventional layer. The better carrier velocity and mobility in the carrier supply layer of the resulting pseudomorphic MODFET structure translate to better $g_m$, thus, better $f_T$ and $f_{max}$ at high gate bias. FIG. 3 shows a schematic cross-section of an InGaAs channel pseudomorphic MODFET structure in accordance with one embodiment of the invention.

The pseudomorphic MODFET in accordance with the invention, generally indicated by the numeral 10, preferably comprises an n+ GaAs/$In_{0.25}Ga_{0.75}As$/n+ $Al_{0.28}Ga_{0.72}As$ single quantum well with double doping pulses. The top carrier supply layer is n+ GaAs, instead of the conventional n+ AlGaAs or n+ AlInAs. This structure contains an n+ GaAs/$In_{0.25}Ga_{0.75}As$ heterojunction instead of a conventional n+ $Al_xGa_{1-x}As$/$In_yGa_{1-y}As$ heterojunction. The n+ GaAs layer is the carrier supply layer, since it has superior carrier transport properties compared with those of a conventional n+ $Al_xGa_{1-x}As$ or n+ $Al_xIn_{1-x}As$ carrier supply layer.

As shown in FIG. 3, the MODFET 10 comprises a substrate 12. Preferably, the substrate 12 consists of semi-insulating GaAs material. Alternatively, the substrate 12 can consist of InP material. The substrate 12 can be 10 to 12 mils thick, for example.

The MODFET 10 also comprises a buffer layer 14 formed atop the substrate 12. The buffer layer 14 preferably consists of intrinsic (unintentionally doped) GaAs material having a thickness of 5000 Angstroms, for example.

The MODFET 10 further comprises a channel layer 16 situated above the buffer layer 14 and consisting of intrinsic (unintentionally doped) InGaAs. Preferably, the channel layer 16 consists of intrinsic $In_{0.25}Ga_{0.75}As$ material having a thickness of 150 Angstroms, for example.

The MODFET 10 also comprises a top carrier supply layer 18 formed atop the channel layer 16. The top carrier supply layer 18 consists of n+ GaAs material, instead of conventional n+ AlGaAs material, for example. The n+ GaAs material utilized as the top carrier supply layer 18 is preferably doped to a concentration of $2.2 \times 10^{18}/cm^3$ and has a thickness of 100 Angstroms, for example.

The MODFET 10 further comprises an ohmic contact layer 20 situated above the top carrier supply layer 18, on which a source contact 22 and a drain contact 24 are formed and through which a gate contact 26 is provided. The ohmic contact layer 20 preferably consists of n+ GaAs material doped to a concentration of $2 \times 10^{18}/cm^3$ and having a thickness of 500 Angstroms, for example.

The foregoing structure comprises the basic structure for the MODFET 10. Preferably, however, the MODFET 10 comprises the following additional structure, as shown in FIG. 3.

A superlattice buffer layer 28 is preferably formed atop the buffer layer 14 between the buffer layer and the channel layer 16. The superlattice buffer layer 28 preferably consists of GaAs/AlGaAs material, for example, intrinsic or slightly p- $GaAs/Al_{0.28}Ga_{0.72}As$ material, having a thickness of 1000 Angstroms, for example.

Also, a bottom carrier supply layer 30 is formed atop the superlattice buffer layer 28 intermediate the superlattice buffer layer and the channel layer 16. The bottom carrier layer 30 preferably consists of n+ AlGaAs material, such as n+ $Al_{0.28}Ga_{0.72}As$ material, having a thickness of 50 Angstroms, for example.

Additionally, a GaAs spacer layer 32 is preferably formed atop the top carrier supply layer 18. The GaAs spacer layer 32 is preferably n− GaAs material doped to a concentration of $4 \times 10^{16}/cm^3$ and has a thickness of 170 Angstroms, for example.

Furthermore, a Schottky gate layer 34 is preferably interposed between the GaAs spacer layer 32 and the ohmic contact layer 20. The Schottky gate layer 34 forms an etch stop layer beneath the ohmic contact layer 20. Metal is deposited through an etched opening in the ohmic contact layer 20 onto the Schottky gate layer 34 to form the gate 26. The Schottky gate layer 34 preferably consists of intrinsic (unintentionally doped) AlGaAs material, such as intrinsic $Al_{0.28}Ga_{0.72}As$ material, having a thickness of 100 Angstroms, for example.

Finally, a spacer layer 36 consisting of intrinsic (unintentionally doped) AlGaAs material, such as intrinsic $Al_{0.28}Ga_{0.72}As$ material, having a thickness of 20 to 40 Angstroms, for example, can be interposed between the bottom carrier supply layer 30 and the channel layer 16.

Similarly, a spacer layer 38 consisting of intrinsic (unintentionally doped) GaAs or AlGaAs material, such as intrinsic $Al_{0.28}Ga_{0.72}As$ material, having a thickness of 20 to 40 Angstroms, for example, can be interposed between the channel layer 16 and the top carrier supply layer 18.

In one implementation of the layer structure of the MODFET 10 shown in FIG. 3, wafers with n+ GaAs/$In_{0.25}Ga_{0.75}As$/n+ $Al_{0.28}Ga_{0.72}As$ quantum well structure are grown by MBE, and FETs with nominal gate length of 0.33 μm are fabricated on the wafers with conventional semiconductor processing procedures. Considered in more detail, wafers are preferably grown by molecular beam epitaxy in a Modular Varian Gen-II system. To fabricate the MODFET 10, Au-Ge/Ni-Cr/Au ohmic metal is first evaporated and alloyed at 425° C., followed by H+ implantation for device isolation. A gate with a nominal length of 0.33 μm is patterned by e-beam direct-writing. After recessing through the n+ GaAs ohmic contact layer 20 by wet etching, the fabrication process is completed by evaporating and lifting Ti/Pt/Au gate metal. The ohmic contact resistance, measured on a conventional transmission line pattern, is typically about 0.15 Ω·mm.

Hall measurement shows the mobility of this resulting layer structure to be 4900 cm$^2$/Vs and 9800 cm$^2$/Vs at 300K and 77K, respectively. The mobility is lower than in the conventional pseudomorphic MODFET structure, because the mobility measured is the average mobility including the parallel conduction in the n+ GaAs carrier supply layer 16. The carrier concentration is $2.5 \times 10^{12}/cm^2$ at 300K from the same measurement. The donor activation efficiency in this structure is about twice as much as in a conventional pseudomorphic MODFET structure. This high activation efficiency can be attributed to the smaller Si ionization energy in GaAs than in AlGaAs. The DC and RF results from this structure are as follows.

Figure 4A:
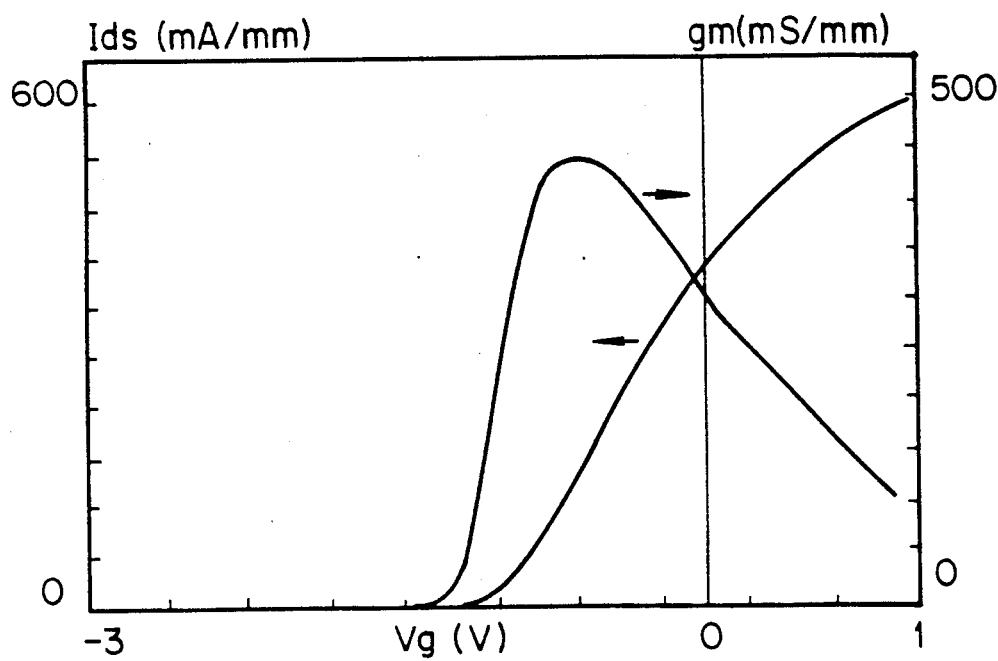
FIGS. 4A and 4B, illustrates $I_{ds}$ and $g_m$ versus $V_{gs}$ curves with $V_{ds}$ at 5 V for a conventional pseudomorphic MODFET (FIG. 4A) and for the pseudomorphic MODFET shown in FIG. 3 (FIG. 4B)
Figure 4B:
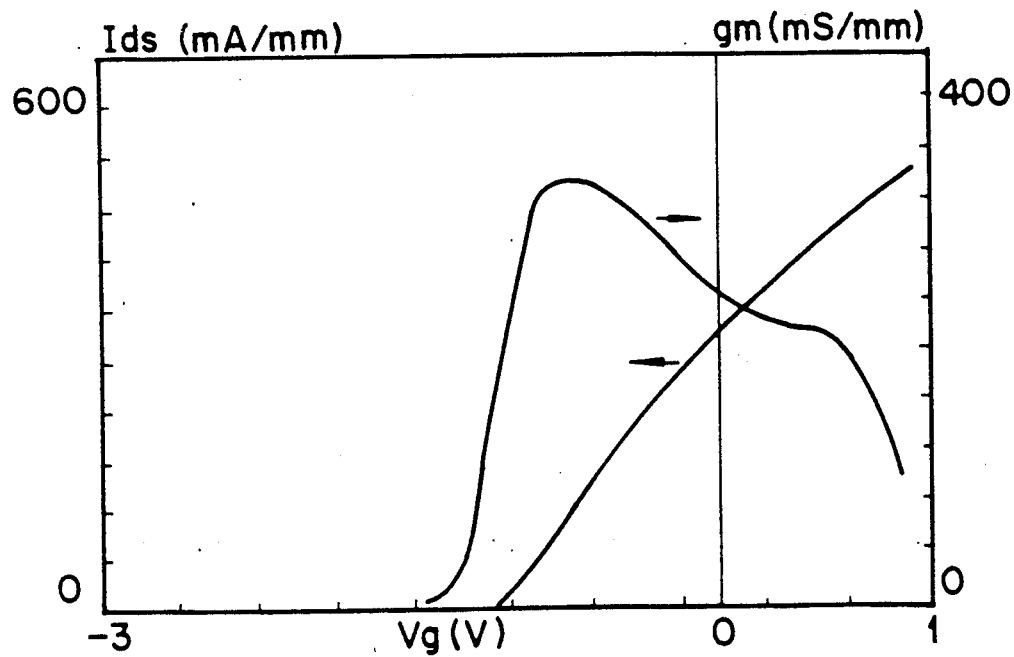

The DC parameters of the MODFET 10 were measured with an HP 4145 Parameter Analyzer available from Hewlett-Packard Company. FIG. 4 compares the $I_{ds}$ and $g_m$ versus $V_{gs}$ curves between a conventional n+ AlGaAs/InGaAs/n+ AlGaAs single quantum well, double pulse doping pseudomorphic MODFET and the MODFET 10 shown in FIG. 3. FIG. 4 illustrates the improvement in $g_m$ at high gate bias that characterizes the structure of the MODFET 10.

Figure 5A:
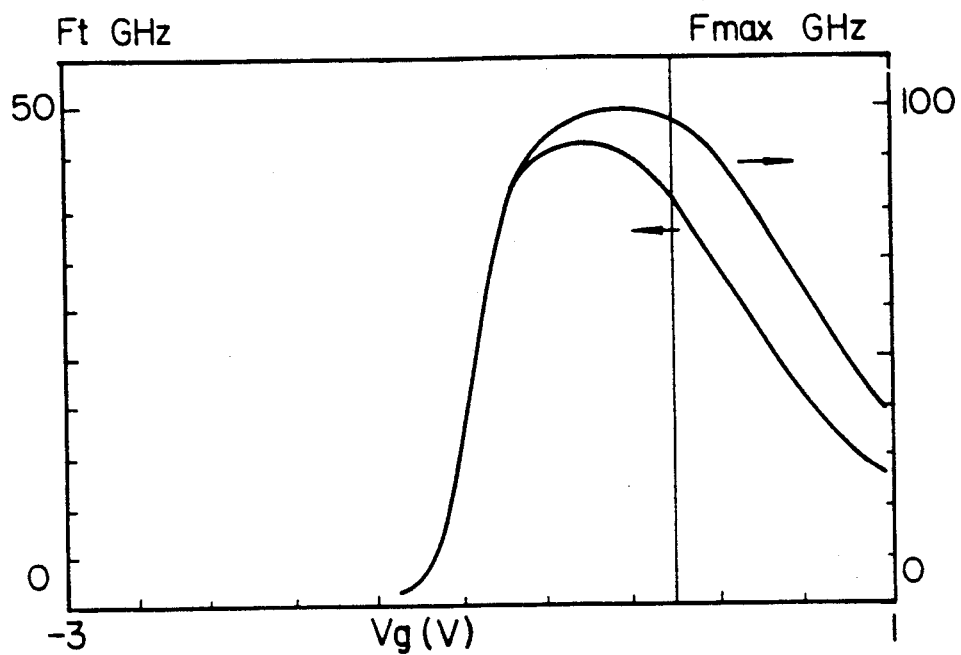
FIGS. 5A and 5B, illustrates $f_T$ and $f_{max}$ versus with $V_{gs}$ $V_{ds}$ at 5 V for a conventional pseudomorphic MODFET (FIG. 5A) and for the pseudomorphic MODFET shown in FIG. 3 (FIG. 5B)
Figure 5B:
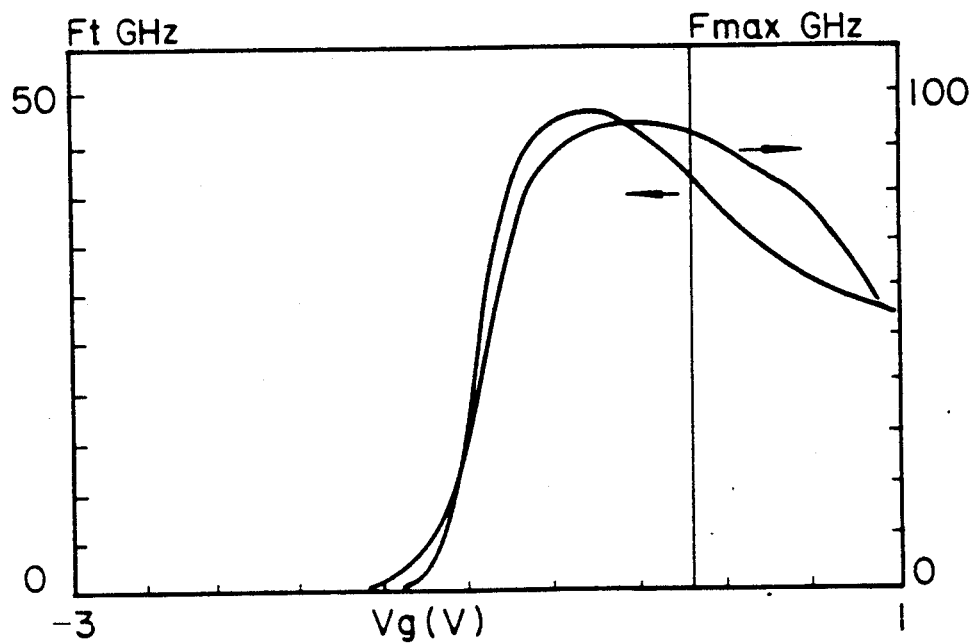

The S-parameters of the MODFET 10 were measured on wafer to 40 GHz with an HP 8510B Network Analyzer available from Hewlett-Packard Company and Cascade Microtech probes. The system was initially calibrated with ISS substrate standards. A peak $f_T$ of 60 GHz at $V_{ds}$ of 2 V was extrapolated from a plot of $H_{21}$ at −6 dB/octave. The $f_T \cdot L_g$ value is comparable to that of conventional pseudomorphic MODFETs reported in L. D. Nguyen, et al., "Charge Control, DC, and RF Performance of a 0.35 μm Pseudomorphic AlGaAs/InGaAs MODFET", IEEE Trans. on Elect. Dev., Vol. 35, No. 2, February 1988, pp. 39–144. The equivalent circuit element values, together with $f_T$ and $f_{max}$, were calculated from the S-parameters measured versus gate bias at 10 GHz as described in B. Hughes, et al., "Bias Dependence of the MODFET Intrinsic Model Element Values at Microwave Frequencies", IEEE Trans. of Elect. Dev., to be published in the October 1989 issue. FIG. 5 shows the $f_T$ and $f_{max}$ versus gate voltage of the MODFET 10 shown in FIG. 3 compared to those of a conventional pseudomorphic MODFET. Both of the $f_T$ and $f_{max}$ curves are relatively flatter/broader for the MODFET 10 due to the improved $g_m$ profile.

Table 1 compares the microwave performance among the GaAs channel MODFET, the InGaAs channel pseudomorphic MODFET, and the MODFET 10.

TABLE 1

| | COMPARISON ON RF & POWER PERFORMANCE | | |
|---|---|---|---|
| Epi. Type | GaAsMODFET | InGaAsMODFET | MODFET 10 |
| ft (GHz) | | | |
| Vds = 5V | 41 | 48 | 49 |
| Vds = 2V | 44 | 58 | 60 |
| fmax(GHz) | | | |
| Vds = 5V | 76 | 97 | 94 |
| Vds = 2V | 70 | 103 | 97 |
| f = 25 GHz | | | |
| P1dB(mw/mm) | 424 | 543 | 679 |
| G1dB(dB) | 9.9 | 11.3 | 12.9 |
| Effi.(%) | 27.3 | 26 | 45 |
| Pmaxadd(mw/mm) | 602 | 914 | 814 |
| Gpmaxadd(dB) | 7.6 | 8.2 | 10.9 |

Figure 6A:
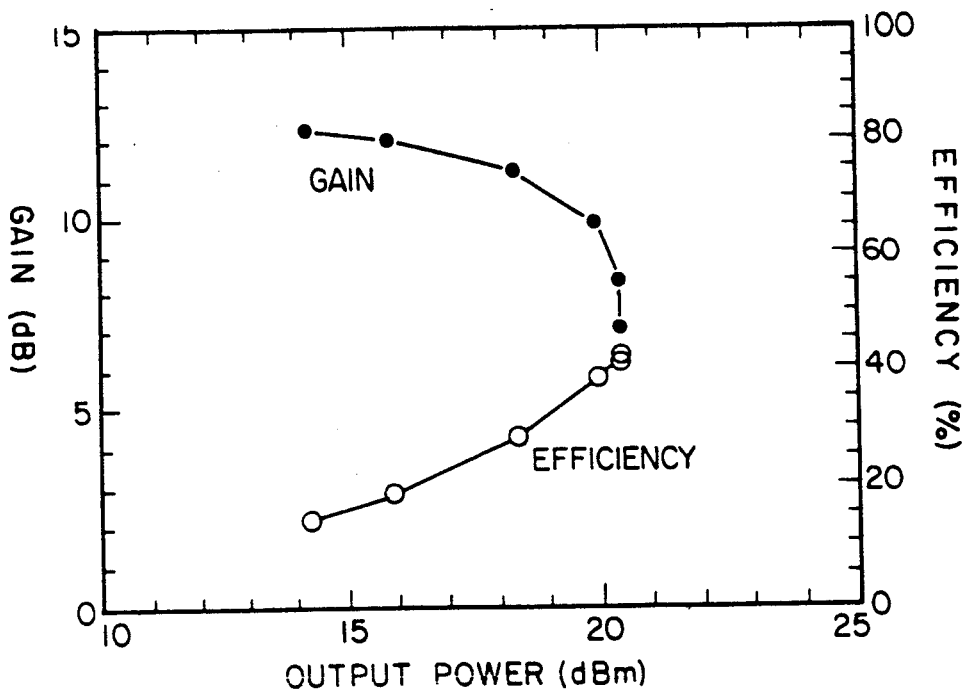
FIGS. 6A and 6B, illustrates gain/power saturation and power added efficiency curves for a 120 $\mu m$ device at 25 GHz with $V_{ds}=5$ V based on a conventional pseudomorphic MODFET structure (FIG. 6A) and based on the pseudomorphic MODFET shown in FIG. 3 (FIG. 6B).
Figure 6B:
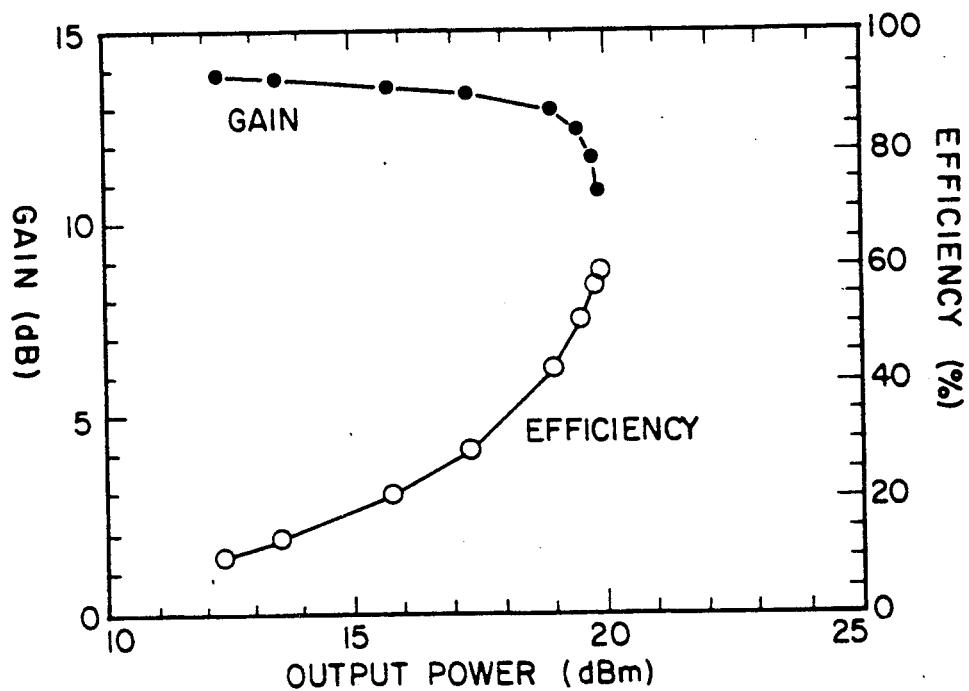

The more constant $f_{max}$ curve translates to a much sharper power/gain saturation characteristic compared to that of a conventional pseudomorphic MODFET, as shown in FIG. 6. The power gain was measured on-wafer with an active-load load-pull system at 25 GHz, as described in K. Kotzebue, et al., "An 18 to 26.5 GHz Waveguide Load-Pull System Using Active-Load Tuning", IEEE MTT-S Tech. Dig., June 1987, pp. 453–456. The devices were tuned for maximum added power. The linear power performance at microwave frequencies with $P_{1db}$ of 0.68 W/mm and $G_{1db}$ of 12.9 dB with power-added-efficiency of 45% were obtained at 25 GHz on a 0.33×120 μm, device biased at 1/2 $I_{max}$ and $V_{DS}=5$ V, which exceed the performance reported in the literature for microwave MODFETs on a GaAs substrate with the same gate length. The power at the maximum-added-power point is as high as 0.81 W/mm with 10.9 dB gain and power-added-efficiency of 59%.

At $V_{DS}=5$ V, the extrinsic peak $g_m$ is about 350 mS/mm to 420 mS/mm depending upon the distance from the gate to the two dimensional electron gas on the actual device. The typical maximum drain current, $I_{max}$, is 530 mA/mm at $V_{DS}=5$ V. The $B_{gd}$ is 7 V at $I_{gd}=-2$ mA/mm. This relatively low $BV_{gd}$ is suspected to be due to insufficient AlGaAs layer thickness underneath the gate. The DC source resistance is typically 0.5 Ω·mm.

The $f_T$ of 60 GHz for the MODFET 10 at $V_{ds}=2$ V is comparable to the best reported $f_T$ of a conventional pseudomorphic MODFET with the same gate length. See L. D. Nguyen, et al., "Charge Control, DC, and RF Performance of a 0.35 μm pseudomorphic AlGaAs/InGaAs MODFET", IEEE Trans. Elect. Dev., Vol. 35, No. 2, February 1988, pp. 139–144. Accordingly, there appears to be no velocity degradation in the undoped InGaAs channel in the structure of the MODFET 10. Because of the elimination of the DX centers by removal of the heavily doped AlGaAs carrier supply layer, the 1/f noise of the MODFET 10 is 10 dB better up to 100 kHz than that of a conventional pseudomorphic MODFET and is comparable to that of a MESFET. The other advantages of the MODFET 10 include better extrinsic delay at large signal level due to the improvement in the saturation of the access drain/source resistors and reduction of DX center related instabilities and anomalies. This structure also is expected to improve the propagation delay in digital applications.

In summary, the relatively superior carrier velocity and mobility in the n+ GaAs carrier supply layer incorporated into the MODFET 10 translate to better $g_m$, and, hence, better $f_T$ and $f_{max}$ at high gate bias. As a consequence, improved linear power performance in the microwave frequency range is achieved. Another advantage of this structure is improvement in the saturation of the access drain and source resistors limited by the 2-D electron concentration in the conventional MODFET, as discussed in P. Roblin, et al., "Nonlinear Parasitics in MODFET's and MODFET I-V Characteristics", IEEE Trans. on Elect. Dev., Vol. 35, No. 8, August 1988. A further advantage of this structure is better charge modulation efficiency and lower trap related generation/recombination noise at low frequency, both due to the elimination of Al in the top carrier supply layer, referred to in M. C. Foisy, et al., "The Role of Inefficiency Charge Modulation in Limiting the Current-Gain Cutoff Frequency of the MODFET", IEEE Trans. on Elect. Dev., Vol. 35, No. 7, July 1988, pp. 871–878, and in S. M. Liu, et al., "Noise Behavior of 1−μm Gate-Length MODFET's from $10^{-2}$ to $10^8$ Hz", IEEE Elect. Dev. Lett., Vol. EDL-6, No. 9, September 1985, pp. 453–455.

The foregoing description is offered primarily for purposes of illustration. While a specific embodiment has been disclosed, it will be readily apparent to those skilled in the art that numerous other modifications can be made. Further improvements in both linear power performance and saturated power level can be achieved by increasing the total carrier concentration in the n+ GaAs carrier supply layer, while maintaining the carrier velocity, or by using a material with higher carrier velocity as the carrier supply layer. Also, improvements can be made through optimization of the layer thickness and doping level to obtain higher $I_{max}$ and flatter $g_m$ for better $P_{1db}$ and $P_{sat}$. Improvements can also be effected by using other heterojunction pairs with better transport properties in the carrier supply layer, while preserving good carrier confinement. Instead of n+ GaAs, n GaAs can alternatively be utilized as the carrier supply layer. With constraints on carrier confinement, lattice mismatches between the layers, and MBE/MOCUD growth compatibilities, n or n+ $In_xGa_{1-x}As$ or n or n+ InP can also be utilized as the carrier supply layer. Also, mole fraction concentrations, doping levels, and layer thicknesses different from those described are contemplated. Such variations and others not mentioned above can still be made without departing from the spirit and scope of the invention as claimed below.

What is claimed is:

1. In an HEMT semiconductor device structure having at least a substrate, a buffer layer formed on one side of the substrate, an InGaAs channel layer situated on a side of the buffer layer opposite from the substrate, a carrier supply layer formed on one side of the channel layer opposite the buffer layer, an ohmic contact layer situated on a side of the carrier supply layer opposite from the InGaAs channel layer, a source contact formed on a surface of the ohmic contact layer opposite from the carrier supply layer, a drain contact formed on the surface of the ohmic contact layer at a distance from the source contact, and a gate contact formed through an opening in the ohmic contact layer, the improvement comprising the carrier supply layer consisting of a higher carrier mobility and velocity material than n+ AlGaAs and n+ AlInAs.

2. The improved HEMT semiconductor device structure of claim 1 wherein the carrier supply layer consists of n+ GaAs material.

3. The improved HEMT semiconductor device structure of claim 1 wherein the carrier supply layer consists of a material selected from among a group of materials comprising n GaAs, n and n+ $In_xGa_{1-x}As$, and n and n+ InP material.

4. A high gain and high linear power HEMT semiconductor device structure comprising:
 a substrate having a first surface and a second surface;
 a buffer layer having a first surface and a second surface, the buffer layer being formed on the substrate with the first surface of the buffer layer in contact with the second surface of the substrate;
 an InGaAs channel layer having a first surface and a second surface, the channel layer being situated above the second surface of the buffer layer;
 a carrier supply layer having a first surface and a second surface, the carrier supply layer consisting of n+ GaAs material, the carrier supply layer being situated above the second surface of the channel layer;
 an ohmic contact layer having a first surface and a second surface, the ohmic contact layer being situated above the second surface of the carrier supply layer;
 a source contact formed on the second surface of the ohmic contact layer;
 a drain contact formed on the second surface of the ohmic contact layer at a distance from the source contact; and
 a gate contact formed through an opening in the ohmic contact layer.

5. The high gain and high linear power HEMT semiconductor device structure of claim 4 wherein the substrate consists of semi-insulating GaAs material.

6. The high gain and high linear power HEMT semiconductor device structure of claim 4 wherein the substrate consists of InP material.

7. The high gain and high linear power HEMT semiconductor device structure of claim 5 wherein the substrate is approximately 10 to 12 mils thick.

8. The high gain and high linear power HEMT semiconductor device structure of claim 6 wherein the substrate is approximately 10 to 12 mils thick.

9. The high gain and high linear power HEMT semiconductor device structure of claim 4 wherein the buffer layer consists of intrinsic GaAs material.

10. The high gain and high linear power HEMT semiconductor device structure of claim 9 wherein the buffer layer has a thickness of approximately 5000 Angstroms.

11. The high gain and high linear power HEMT semiconductor device structure of claim 4 wherein the channel layer consists of intrinsic $In_{0.25}Ga_{0.75}As$ material.

12. The high gain and high linear power HEMT semiconductor device structure of claim 11 wherein the channel layer has a thickness of approximately 150 Angstroms.

13. The high gain and high linear power HEMT semiconductor device structure of claim 4 wherein the carrier supply layer is doped to a concentration of $2.2 \times 10^{18}/cm^3$ and has a thickness of approximately 100 Angstroms.

14. The high gain and high linear power HEMT semiconductor device structure of claim 4 wherein the ohmic contact layer consists of n+ GaAs material doped to a concentration of $2 \times 10^{18}/cm^3$ and has a thickness of approximately 500 Angstroms.

15. The high gain and high linear power HEMT semiconductor device structure of claim 4, further comprising:
 a superlattice buffer layer having a first surface and a second surface, the superlattice buffer layer being formed on the buffer layer with the first surface of the superlattice buffer layer in contact with the second surface of the buffer layer;
 a second carrier supply layer having a first surface and a second surface, the second carrier supply layer being formed on the superlattice buffer layer with the first surface of the second carrier supply layer in contact with the second surface of the superlattice buffer layer so that the second carrier layer is intermediate the superlattice buffer layer and the channel layer;
 a GaAs spacer layer having a first surface and a second surface, the GaAs spacer layer being formed on the first carrier supply layer with the first surface of the GaAs spacer layer in contact with the second surface of the first carrier supply layer; and
 a Schottky gate layer having a first surface and a second surface, the Schottky gate layer being formed on the GaAs spacer layer with the first surface of the Schottky gate layer in contact with the second surface of the GaAs spacer layer;
 the ohmic contact layer being formed on the second surface of the Schottky gate layer with the first surface of the ohmic contact layer being in contact with the second surface of the Schottky gate layer, the Schottky gate layer forming an etch stop layer beneath the ohmic contact layer, metal being deposited through the opening in the ohmic contact layer onto the second surface of the Schottky gate layer to form the gate.

16. The high gain and high linear power HEMT semiconductor device structure of claim 15 wherein the superlattice buffer layer consists of GaAs/AlGaAs material, the second carrier supply layer consists of n+ AlGaAs material, and the Schottky gate layer consists of intrinsic AlGaAs material.

17. The high gain and high linear power HEMT semiconductor device structure of claim 16 wherein the superlattice buffer layer consists of a material selected from among the group of materials comprising intrinsic and slightly p- GaAs/$Al_{0.28}Ga_{0.72}As$ material and has a thickness of approximately 1000 Angstroms, the second carrier supply layer consists of n+ $Al_{0.28}Ga_{0.72}As$ material and has a thickness of approximately 50 Angstroms, the GaAs spacer layer is doped to a concentration of $4 \times 10^{16} cm^3$ and has a thickness of approximately 170 Angstroms, and the Schottky gate layer consists of intrinsic $Al_{0.28}Ga_{0.72}As$ material and has a thickness of approximately 100 Angstroms.

18. The high gain and high linear power HEMT semiconductor device structure of claim 15, further comprising:
   a second spacer layer having a first surface and a second surface, the second spacer layer being formed on the second surface of the second carrier supply layer with the first surface of the second spacer layer in contact with the second surface of the second carrier supply layer;
   the channel layer being formed on the second surface of the second spacer layer with the first surface of the channel layer being in contact with the second surface of the second spacer layer; and
   a third spacer layer having a first surface and a second surface, the third spacer layer being formed on the second surface of the channel layer with the first surface of the third spacer layer in contact with the second surface of the channel layer;
   the first carrier supply layer being formed on the second surface of the third spacer layer with the first surface of the first carrier layer being in contact with the second surface of the third spacer layer.

19. The high gain and high linear power HEMT semiconductor device structure of claim 18 wherein the second spacer layer consists of intrinsic AlGaAs material and the third spacer layer consists of a material selected from among the group of materials comprising intrinsic GaAs and intrinsic AlGaAs material.

20. The high gain and high linear power HEMT semiconductor device structure of claim 19 wherein the second spacer layer consists of intrinsic $Al_{0.28}Ga_{0.72}As$ material and has a thickness of approximately 20 to 40 Angstroms and the third spacer layer consists of a material selected from among the group of materials comprising intrinsic GaAs and intrinsic $Al_{0.28}Ga_{0.72}As$ material and has a thickness of approximately 20 to 40 Angstroms.

* * * * *

UNITED STATES PATENT AND TRADEMARK OFFICE
CERTIFICATE OF CORRECTION

PATENT NO. : 5,038,187
DATED : Aug. 6, 1991
INVENTOR(S) : Guo-Gang Zhou

It is certified that error appears in the above-indentified patent and that said Letters Patent is hereby corrected as shown below:

On the Title page, in the Abstract:

Line 11, "improved $R_{1dB}$ and $G_{1dB}$" should read -- improved $P_{1dB}$ and $G_{1dB}$ --;

Column 3, Line 51, "versus with $V_{gs}$ $V_{ds}$ at 5 V" should read -- versus $V_{gs}$ with $V_{ds}$ at 5 V --;

Column 6, Line 59, "39-144" should read -- 139-144 --;

Column 7, Line 33, "0.33 x 120 $\mu$m, device" should read -- 0.33 x 120 $\mu m^2$ device --.

Signed and Sealed this

Twenty-fifth Day of January, 1994

Attest:

BRUCE LEHMAN

*Attesting Officer*  *Commissioner of Patents and Trademarks*